United States Patent [19]

Shimizu et al.

[11] Patent Number: 4,683,044

[45] Date of Patent: Jul. 28, 1987

[54] METHOD OF MANUFACTURING AN ELECTROLUMINESCENT PANEL WITHOUT ANY ADVERSE INFLUENCE ON AN UNDERLYING LAYER

[75] Inventors: Yasumoto Shimizu; Takeo Matsudaira, both of Tokyo, Japan

[73] Assignee: 501 Hoya Corporation, Tokyo, Japan

[21] Appl. No.: 879,050

[22] Filed: Jun. 26, 1986

[30] Foreign Application Priority Data

Jun. 26, 1985 [JP] Japan .............................. 60-139894
Jun. 26, 1985 [JP] Japan .............................. 60-140780

[51] Int. Cl.[4] .............................................. C23C 14/00

[52] U.S. Cl. .......................... 204/192.26; 204/192.12; 204/192.17; 204/192.22; 204/192.23; 204/192.28; 204/192.29; 427/69; 427/419.3

[58] Field of Search ............................. 427/69, 419.3; 204/192.12, 192.17, 192.22, 192.23, 192.26, 192.29, 192.28

[56] References Cited

U.S. PATENT DOCUMENTS 4,027,192 5/1977 Hanak .............................. 204/192.26
4,279,726 7/1981 Baird et al. ..................... 204/192.26
4,389,295 6/1983 Davey et al. ..................... 204/192.26
4,508,610 4/1985 Freeman et al. ................ 204/192.26

*Primary Examiner*—Arthur P. Demers
*Attorney, Agent, or Firm*—Roberts, Spiecens & Cohen

[57] ABSTRACT

In an electroluminescent panel which in turn comprises a transparent electrode member on a transparent substrate, a first dielectric layer, an electroluminescent layer, a second dielectric layer, and a back electrode member, at least one of the first and the second dielectric layers is divided into first and second partial dielectric films nearer to and farther from the transparent electrode member, respectively. The first partial dielectric film is deposited in a nonoxidization atmosphere by the use of a pellet which essentially consists of silicon and oxygen. Thereafter, the second partial dielectric film is deposited on the first partial dielectric film in an oxygen atmosphere and has a relative dielectric constant greater than the first partial dielectric film. Alternatively, each of the first and the second dielectric layers may comprise the first partial dielectric film of silicon and oxide and the second partial dielectric film mentioned above.

9 Claims, 3 Drawing Figures

METHOD OF MANUFACTURING AN ELECTROLUMINESCENT PANEL WITHOUT ANY ADVERSE INFLUENCE ON AN UNDERLYING LAYER

BACKGROUND OF THE INVENTION

This invention relates to an electroluminescent panel for use in displaying an image, such as alphanumeric symbols, a static picture, a motion picture, and the like, in an input/output device of a computer and so forth.

As a rule, an electroluminescent panel of the type described is known as a display device of a flat type and comprises a transparent substrate, a transparent electrode member on the transparent substrate, a back electrode member opposite to the transparent electrode member, and an electroluminescent layer intermediate between the transparent and the back electrode members. The transparent electrode member is divided into a first set of conductors extended in a predetermined direction while the back electrode member is divided into a second set of conductors extended along another direction intersecting the predetermined direction.

In such an electroluminescent panel, a first dielectric layer is interposed between the transparent electrode member and the electroluminescent layer. In addition, a second dielectric layer is often laid between the electroluminescent layer and the back electrode member. Each of the first and the second dielectric layers should have a high breakdown voltage and a high relative dielectric constant in addition to a low dielectric loss.

In addition, the first dielectric layer should intimately adhere to both the transparent electrode member and the electroluminescent layer and should withstand a heat treatment of a high temperature because the electroluminescent layer must inevitably be subjected to the heat treatment so as to activate the electroluminescent layer. In other words, cracks and peel off must strictly be avoided in the first dielectric layer during and after the heat treatment.

Likewise, the second dielectric layer must tenaciously adhere to both the electroluminescent layer and the back electrode member. Occurrence of cracks and peel off should also be avoided in the second dielectric layer like in the first dielectric layer. Moreover, the second dielectric layer must be resistant to an etchant which is used on forming the second-set conductors of the back electrode member. Otherwise, the etchant might adversely affect the electroluminescent layer underlying the second dielectric layer, as a result of permeation of the etchant into the electroluminescent layer.

In Japanese patent publication No. Syô 58-175,294 (175,294/1983), Y. Fujita et al point out that, when each of the first and the second dielectric layers is deposited by sputtering in the presence of oxygen plasma, the transparent electrode member and the electroluminescent layer are subjected to serious damage by the oxygen plasma during deposition of the first and the second dielectric layers, respectively. Such damage deteriorates characteristics of both the electroluminescent layer and the transparent electrode member. More particularly, the transparent electrode member is unpleasingly reduced in conductivity due to the damage and blackened or darkened due to the damage. The second dielectric layer is peeled off from the electroluminescent layer.

In order to avoid the damage resulting from the oxygen plasma, each of the first and the second dielectric layers is made of a compound of $Si_3N_4$—AlN—$Al_2O_3$—$SiO_2$, which is referred to as SiAlON. The layer of SiAlON can be deposited by sputtering a target of a mixture of $Si_3N_4$ powder and $Al_2O_3$ powder in an atmosphere of argon and nitrogen without occurrence of any oxygen plasma.

However, such a compound layer of SiAlON has a low dielectric constant between 6 and 7. Therefore, it is difficult to effectively supply the electroluminescent layer with an a.c. electric field. Inasmuch as the compound layer is complexed in composition, it is difficult to adjust each ingredient to a desired range.

SUMMARY OF THE INVENTION

It is an object of this invention to provide a method of manufacturing an electroluminescent panel, which can deposit a dielectric layer of a high dielectric constant without any damage of a transparent electrode member and/or an electroluminescent layer.

It is another object of this invention to provide a method of the type described, which is capable of avoiding any damage resulting from irradiation of oxygen plasma without use of a complexed compound, such as SiAlON.

It is still another object of this invention to provide a method of the type described, which can prevent a transparent electrode member from being blackened or darkened due to irradiation of oxygen plasma.

It is yet another object of this invention to provide a method of the type described, which can prevent a dielectric layer from peeling off an electroluminescent layer.

According to this invention, a method is for use in manufacturing an electroluminescent panel which comprises a transparent substrate, a transparent electrode member on the transparent substrate, a back electrode member opposite to the transparent electrode member, an electroluminescent layer between the transparent electrode member and the back electrode member, a first dielectric layer between the transparent electrode member and the electroluminescent layer, and a second dielectric layer between the electroluminescent layer and the back electrode member. Preselected at least one of the first and the second dielectric layers is divisible into a first partial dielectric film near to the transparent electrode layer and a second partial dielectric film further from the transparent electrode layer than the first partial dielectric film. The method comprises the steps of preparing a pellet of a composition which essentially consists of silicon and oxygen, depositing the first partial dielectric film in a nonoxidization atmosphere by the use of the pellet, and depositing the second partial dielectric film on the first partial dielectric film to form the preselected one of the first and the second dielectric layers.

DESCRIPTION OF THE PREFERRED EMBODIMENTS

Figure 1:
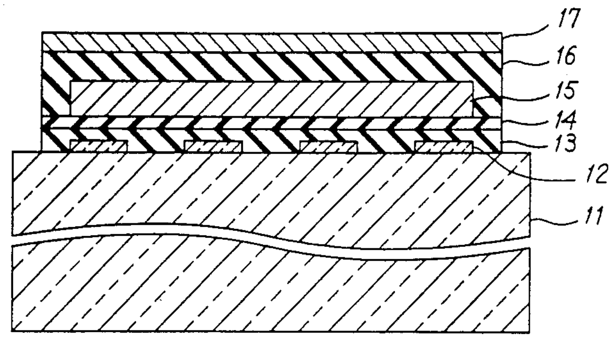
FIG. 1 is a sectional view of an electroluminescent panel for use in describing a method according to a first embodiment of this invention.

Referring to FIG. 1, description will be made about an electroluminescent panel which is manufactured by a method according to a first embodiment of this invention. At first, provision is made of a transparent substrate 11 of aluminosilicate glass which may be NA40 manufactured and sold by HOYA Corporation. The transparent substrate 11 has a first principal surface directed upwards and a second principal surface directed downwards.

A transparent conductive layer is deposited to a thickness of 2000 angstroms on a whole of the first principal surface of the transparent substrate 11 by sputtering. The sputtering is carried out in an oxygen atmosphere within a chamber of a sputtering apparatus. The transparent conductive layer may be of indium oxide ($In_2O_3$) doped with stannic oxide ($SnO_2$). Subsequently, the transparent conductive layer is subjected to wet etching by the use of usual photolithography technique into a transparent electrode member 12 which consists of a first set of conductors. Each of the first-set conductors is extended in parallel to one another in a direction perpendicular to the sheet of FIG. 1.

After formation of the transparent electrode member 12, a pellet of silicon dioxide ($SiO_2$), namely, a target is introduced into the chamber. In this event, the chamber may be changed to another chamber. Herein, it is to be noted that the chamber is put into a nonoxidization atmosphere. For this purpose, the chamber is filled with an argon gas (Ar) to a pressure of $7\times10^{-1}$ Pa. The substrate 11 with the transparent electrode member 12 is heated to 200° C.

Under the circumstances, the target of silicon dioxide is sputtered in the above-mentioned nonoxidization atmosphere. As a result, a silicon dioxide film 13 is deposited on the transparent electrode member 12 to a thickness of 100 angstroms without occurrence of oxygen plasma in the chamber. Therefore, the transparent electrode member 12 is never exposed to oxygen plasma.

It has been found out that the silicon dioxide film 13 is in close contact with the transparent electrode member 12 of indium oxide doped with stannic oxide and tenaciously adheres to the above-mentioned transparent electrode member 12, although the relative dielectric constant of silicon dioxide is between 4 and 6 and is therefore comparatively low.

On the silicon dioxide film 13, a dielectric film 14 of tantalum pentoxide ($Ta_2O_5$) which may be called a tantalum pentoxide film is deposited to a thickness of 4000 angstroms by sputtering. Such sputtering is carried out with the substrate kept at a temperature of 200° C. by the use of a tantalum target in an atmosphere of a mixed gas of 90% of argon gas and 10% of oxygen gas at a pressure of $7\times10^{-1}$ Pa. The sputtering may be referred to as reactive sputtering. The chamber may be identical with the chamber used in the preceding processes or different from it.

The tantalum pentoxide film intimately adheres to the silicon dioxide film 13 and has a high relative dielectric constant in comparison with the silicon dioxide film 13. It has been found out that the relative dielectric constant of the tantalum pentoxide film 14 is between 25 and 27 and remarkably greater than SiAlON.

A combination of the silicon dioxide film 13 and the tantalum pentoxide film 14 may collectively be referred to as a first dielectric layer. In this connection, the silicon dioxide film 13 and the tantalum pentoxide film 14 may be called first and second partial dielectric films, respectively.

Anyway, the first partial dielectric film 13 is adjacent to the transparent electrode member 12 while the second partial dielectric film 14 is farther from the transparent electrode member 12 than the first partial dielectric film 13.

After deposition of the first dielectric layer (13 and 14), an electroluminescent layer 15 is deposited on the second partial dielectric film 14 to a thickness of 6000 angstroms in an evaporation chamber. Thus, the electroluminescent layer 15 is formed by evaporation by the use of an evaporation source comprising zinc sulfide (ZnS) doped with manganese (Mn) of 0.5% by weight. The manganese serves as an activator for electroluminescence. Subsequently, the substrate 11 with the electroluminescent layer 15 is annealed at a temperature between 400° C. and 500° C. in a vacuum.

In FIG. 1, a second dielectric layer 16 of tantalum pentoxide is deposited to a thickness of 4000 angstroms by sputtering in a manner similar to the second partial dielectric film 14 and is in intimate contact with the electroluminescent layer 15 and partially with the second partial dielectric film 14. Such a second dielectric layer 16 serves to effectively supply an electric field to the electroluminescent layer 15.

Therefore, an aluminum layer is formed on the second dielectric layer 16 and etched by the use of a photolithography technique into a back electrode member 17. The back electrode member 17 consists of a second set of conductors which are extended along a direction intersecting the first-set conductors.

With this method, deterioration of the transparent electrode member 12 can be prevented such that the transparent electrode member 12 is blackened or increased in electric resistivity, in spite of the fact that the first and the second partial dielectric films 13 and 14 are composed of oxide materials, such as the silicon dioxide and the tantalum pentoxide. This is because the transparent electrode member 12 can effectively be protected from the deterioration by the first partial dielectric film 13 of silicon dioxide.

Similar deterioration may occur on annealing the substrate 11 for activation of the electroluminescent layer 15. It has been confirmed that interposition of the silicon dioxide film 13 is also effective to prevent the deterioration, such as blackening and an increase of resistance, which might occur on annealing the substrate 11 for activation.

As regards the relative dielectric constant, the first partial dielectric film 13 of silicon dioxide is as thin as possible because the silicon dioxide film itself has a low relative dielectric constant, as mentioned before. Taking the blackening, the increase of resistance, the relative dielectric constant, and adhesion between the transparent substrate 11 and the transparent electrode member 12 into consideration, the first partial dielectric film 13 may be equal to or thicker than 10 angstroms and may not exceed 500 angstroms. The first partial dielectric film 13 and the target may include any other compound or compounds of silicon oxide than silicon dioxide.

Figure 2:
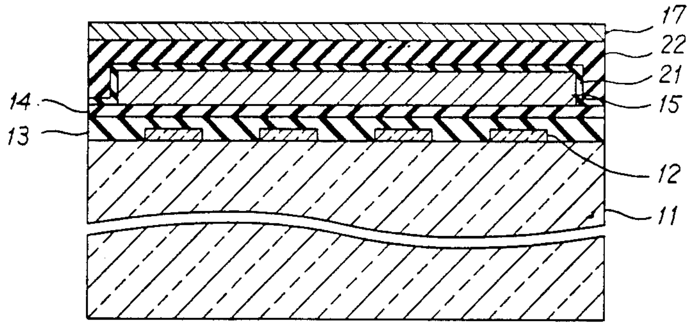
FIG. 2 is a sectional view of an electroluminescent panel for use in describing a method according to a second embodiment of this invention.

Referring to FIG. 2, description will be made about an electroluminescent panel which is manufactured by a method according to a second embodiment of this invention and which comprises similar parts designated by like reference numerals. In FIG. 2, the first dielectric layer is formed by the first partial dielectric film 13 of silicon dioxide and the second partial dielectric film 14 of tantalum pentoxide both of which are deposited in the manner described in conjunction with FIG. 1. It is to be noted that the second dielectric layer comprises a first additional dielectric film 21 of silicon dioxide covered on the electroluminescent layer 15 and a second additional dielectric film 22 of tantalum pentoxide deposited on the first additional dielectric film 21.

The first additional dielectric film 21 is deposited to a thickness of 100 angstroms by sputtering a target of quartz, namely, silicon dioxide in a nonoxidization atmosphere and is partially laid on the second partial dielectric film 14. This means that no oxygen plasma appears during the sputtering. Such sputtering is carried out with an argon gas kept at a pressure of $7\times10^{-1}$ Pa and with an object, namely, substrate kept at a temperature of 200° C. after the electroluminescent layer 15 is annealed at a temperature between 400° C. and 500° C.

Subsequently, the second additional dielectric film 22 of tantalum pentoxide is deposited on the first additional dielectric film 21 to a thickness of 4000 angstroms by sputtering. The sputtering is carried out in an atmosphere of a mixed gas comprising 90% of argon and 10% of oxygen with a pressure of the mixed gas kept at $7\times10^{-1}$ Pa and with the object kept at 200° C. Oxygen plasma takes place in the atmosphere of the mixed gas during the reactive sputtering.

Thereafter, the back electrode member 17 of aluminum is formed in the manner described in conjunction with FIG. 1.

With the above-mentioned structure, the electroluminescent layer 15 is completely covered with the first additional dielectric film 21 and is therefore never exposed to oxygen plasma appearing during deposition of the second additional dielectric film 22. As a result, the electroluminescent layer 15 never suffers from any damage which may otherwise result from the oxygen plasma. Thus, the first additional dielectric film 21 serves to protect the electroluminescent layer 15 from being deteriorated by the oxygen plasma.

In addition, the first additional dielectric film 21 tenaciously adheres to both the electroluminescent layer 15 and the second additional dielectric film 22 of tantalum pentoxide. It is therefore possible to protect peeling off of the second additional dielectric film 22.

As mentioned in conjunction with FIG. 1, the first additional dielectric film 21 of silicon dioxide has a relative dielectric constant lower than that of the second additional dielectric film 22 of tantalum pentoxide. Under the circumstances, it is possible to improve various characteristics of the electroluminescent panel, by restricting a thickness of the first additional dielectric film 21 to a desired range. A lower limit of the desired range is determined by adhesion of the electroluminescent layer 15 to the first additional dielectric film 21 and by chemical resistance to an etchant used to form the back electrode member 17. Taking the above into consideration, the lower limit of the desired range may be equal to or greater than 10 angstroms.

On the other hand, an upper limit of the desired range of the first additional dielectric film 21 is determined in consideration of effective electric field which has a field intensity enough to make the electroluminescent layer 15 luminous. According to the inventors' experimental studies, the electroluminescent layer 15 is brightly lit when the first additional dielectric film 21 is equal to or less than 500 angstroms.

Like in FIG. 1, the first additional dielectric film 21 and the target may include any other compound of silicon oxide than silicon dioxide and can be therefore specified by $Si_xO_y$.

Although sputtering is used to deposit the first additional dielectric film 21, vacuum evaporation may be used instead of the sputtering.

With the above-mentioned method, it is possible to protect not only the transparent electrode member 12 but also the electroluminescent layer 15 from any damage resulting from oxygen plasma. In addition, the second partial dielectric film 14 and the second additional dielectric film 22 do not peel off from the transparent electrode member 12 and the electroluminescent layer 15 by virtue of interposition of the first partial dielectric film 13 and the first additional dielectric film 21, respectively.

Figure 3:
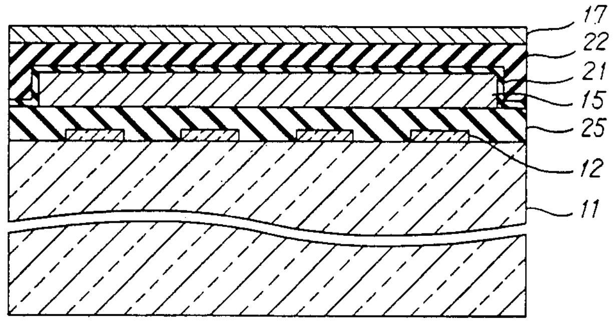
FIG. 3 is a sectional view of an electroluminescent panel for use in describing a method according to a third embodiment of this invention.

Referring to FIG. 3, an electroluminescent panel will be shown to describe a method according to a third embodiment of this invention. The electroluminescent panel illustrated in FIG. 3 is similar to that illustrated in FIG. 2 except that a first dielectric layer depicted at 25 consists of a single layer of tantalum pentoxide ($Ta_2O_5$).

The transparent electrode member 12 is formed on the transparent substrate 11 in the manner described in conjunction with FIGS. 1 and 2 by depositing a transparent conductive layer of 2000 angstroms and by etching the transparent conductive layer into a first set of conductors by the use of photolithography technique. Next, a layer of tantalum pentoxide is deposited as the first dielectric layer 25 to a thickness of 2000 angstroms by sputtering in an atmosphere of a mixed gas comprising 90% of argon and 10% of oxygen with a pressure of the mixed gas kept at $7\times10^{-1}$ Pa and with the substrate 11 kept at 200° C. The sputtering is therefore reactive sputtering.

Subsequently, the electroluminescent layer 15, the first and the second additional dielectric films 21 and 22, and the back electrode member 17 are successively formed in a manner similar to that described with reference to FIG. 2.

With this structure, the first additional dielectric film 21 is in close contact with both the electroluminescent layer 15 and the second additional dielectric film 22 and protects the electroluminescent layer 15 from any damage, although the transparent electrode member 12 is exposed to the oxygen plasma during deposition of the first dielectric layer 25.

As readily understood from the methods according to the first through third embodiments of this invention, each of the first and the second dielectric layers may selectively be divided into two thin films one of which is deposited by the use of the pellet of silicon and oxygen in the nonoxidization atmosphere and which is nearest to the transparent substrate 11. In this connection, the two thin films in a divided dielectric layer may be called first and second partial dielectric films, respectively, and the first partial dielectric film may be of silicon oxide again.

While this invention has thus far been described in conjunction with a few embodiments thereof, it will readily be possible for those skilled in the art to put this invention into practice in various other manners. For example, any mixture ratio of silicon and oxygen may be included in the pellet or target for depositing the silicon oxide film. The first partial dielectric film 13 may include any other compound or compounds of silicon and oxygen than the silicon dioxide as a result of sputtering, though the first partial dielectric film 13 has thus far been described as the silicon dioxide film.

In addition, deposition of the first partial dielectric film 13 or 21 may be carried out in the nonoxidization atmosphere. Another inert gas such as xenon (Xe), krypton (Kr), may be used, instead of argon so as to form the nonoxidization atmosphere.

The second partial dielectric film 14 or 22 may be a single film or superposition of a plurality of films and may consist of at least one of ingredients selected from a group of tantalum pentoxide, yttrium oxide, aluminum oxide, barium tantalate ($BaTa_2O_6$), lead titanate ($PbTiO_3$), zirconium dioxide ($ZrO_2$), silicon nitride ($Si_3N_4$), and silicon oxynitride. More specifically, the second partial dielectric film 14 or 22 may have high relative dielectric constants and intimately adhere to each of the transparent electrode member 12 and the electroluminescent layer 15. For instance, $Y_2O_3$, $Si_3N_4$, $Al_2O_3$, and $BaTa_2O_6$ have the relative dielectric constants between 10 and 15, between 7 and 9, and between 7 and 8, and between 20 and 22, respectively.

The electroluminescent layer 15 may include, as a dopant, $Tbf_3$, $SmF_3$, $PrF_3$, $DyF_3$, $ErF_3$, or the like, in lieu of Mn. Alternatively, ZnSe may be substituted for ZnS in the electroluminescent layer 15. The transparent substrate may be plastic resistant to a high temperature treatment.

What is claimed is:

1. A method of manufacturing an electroluminescent panel which comprises a transparent substrate, a transparent electrode member on said transparent substrate, a back electrode member opposite to said transparent electrode member, an electroluminescent layer between said transparent electrode member and said back electrode member, a first dielectric layer between said transparent electrode member and said electroluminescent layer, and a second dielectric layer between said electroluminescent layer and said back electrode member, preselected at least one of said first and said second dielectric layers being divisible into a first partial dielectric film near to said transparent electrode layer and a second partial dielectric film further from said transparent electrode layer than said first partial dielectric film, the method comprising the steps of:

preparing a pellet of a composition which essentially consists of silicon and oxygen;

depositing said first partial dielectric film in a nonoxidization atmosphere by the use of said pellet; and depositing said second partial dielectric film on said first partial dielectric film to form said preselected one of the first and the second dielectric layers.

2. A method as claimed in claim 1, wherein said preselected at least one of the first and the second dielectric layers is said first dielectric layer.

3. A method as claimed in claim 2, wherein said first partial dielectric film is in contact with said transparent conductive member.

4. A method as claimed in claim 1, wherein said preselected at least one of the first and the second dielectric layer is said second dielectric layer.

5. A method as claimed in claim 4, wherein said first partial dielectric film is in contact with said electroluminescent layer.

6. A method as claimed in claim 5, wherein said first partial dielectric film has a thickness between 10 angstroms and 500 angstroms, both inclusive.

7. A method as claimed in claim 1, wherein said first partial dielectric film has a relative dielectric constant lower than that of said second partial dielectric film.

8. A method as claimed in claim 1, wherein said preselected at least one of the first and the second dielectric layers is each of said first and said second dielectric layers.

9. A method as claimed in claim 1, wherein the second partial dielectric film depositing step is carried out in an oxygen atmosphere.

* * * * *

UNITED STATES PATENT AND TRADEMARK OFFICE

CERTIFICATE OF CORRECTION

PATENT NO. : 4,683,044

DATED : July 28, 1987

INVENTOR(S) : Shimizu et al.

It is certified that error appears in the above—identified patent and that said Letters Patent is hereby corrected as shown below:

Title page:

The correct name of the assignee is --Hoya Corporation, Tokyo Japan--

Signed and Sealed this

Seventh Day of February, 1989

*Attest:*

DONALD J. QUIGG

*Attesting Officer*

*Commissioner of Patents and Trademarks*